US007949968B2

(12) United States Patent
Jacobi et al.

(10) Patent No.: US 7,949,968 B2
(45) Date of Patent: May 24, 2011

(54) METHOD AND SYSTEM FOR BUILDING BINARY DECISION DIAGRAMS OPTIMALLY FOR NODES IN A NETLIST GRAPH USING DON'T-CARING

(75) Inventors: Christian Jacobi, Boblingen (DE); Udo Krautz, Stuttgart (DE); Viresh Paruthi, Austin, TX (US); Matthias Pflanz, Schoenaich (DE); Kai O. Weber, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 559 days.

(21) Appl. No.: 11/683,495

(22) Filed: Mar. 8, 2007

(65) Prior Publication Data

US 2008/0222590 A1 Sep. 11, 2008

(51) Int. Cl.
*G06F 17/50* (2006.01)
(52) U.S. Cl. ...................................... 716/100
(58) Field of Classification Search ............... 716/5, 100
See application file for complete search history.

(56) References Cited

U.S. PATENT DOCUMENTS

| 6,148,436 | A  | * | 11/2000 | Wohl .............................. 716/18 |
| 6,473,884 | B1 |   | 10/2002 | Ganai et al. |
| 7,412,674 | B1 | * | 8/2008 | Singhal et al. ..................... 716/5 |
| 2004/0098682 | A1 | * | 5/2004 | Jain ..................................... 716/5 |
| 2006/0190868 | A1 | * | 8/2006 | Baumgartner et al. ........... 716/5 |
| 2007/0118339 | A1 | * | 5/2007 | Moon ................................ 703/2 |
| 2007/0130549 | A1 | * | 6/2007 | Eisner et al. ...................... 716/2 |
| 2007/0174804 | A1 | * | 7/2007 | Sasao et al. ....................... 716/18 |
| 2008/0109774 | A1 | * | 5/2008 | Baumgartner et al. ........... 716/5 |
| 2008/0235637 | A1 | * | 9/2008 | Baumgartner et al. ........... 716/4 |
| 2008/0301602 | A1 | * | 12/2008 | Koelbl et al. ..................... 716/5 |

OTHER PUBLICATIONS

Randal E, Bryant; "Graph-Based Algorithms for Boolean Function Manipulation"; IEEE Transactions on Computers; vol. C-35; Aug. 1986; pp. 677-691.

* cited by examiner

*Primary Examiner* — Jack Chiang
*Assistant Examiner* — Suchin Parihar
(74) *Attorney, Agent, or Firm* — Dillon & Yudell LLP

(57) ABSTRACT

An improved method, system and computer-readable medium for constructing binary decision diagrams for a netlist graph is disclosed. The method comprises traversing a netlist graph in a depth-first manner. At least one binary decision diagram is built for one input of a node of the netlist graph using a binary decision diagram for the other input of that node as a don't-care condition.

14 Claims, 4 Drawing Sheets

METHOD AND SYSTEM FOR BUILDING BINARY DECISION DIAGRAMS OPTIMALLY FOR NODES IN A NETLIST GRAPH USING DON'T-CARING

BACKGROUND OF THE INVENTION

1. Field of the Invention

The present invention relates in general to verifying designs and in particular to representing a logic function in a decision diagram. Still more particularly, the present invention relates to a system, method and computer program product for building binary decision diagrams more optimally using don't-caring.

2. Description of the Related Art

Many tasks in computer-aided design (CAD) of digital circuits, such as equivalence checking, property checking, logic synthesis, false-paths analysis require Boolean reasoning on problems derived from circuit structures. A netlist graph is a means of representing problems derived from these circuit structures. Such a representation is non-canonical and offers limited ability to reason about the function at the nodes in the graph. Binary decision diagrams (BDDs) can be used for efficiently applying Boolean reasoning to problems derived from such circuit structures. BDDs offer a compact and functionally canonical representation of the Boolean function of a graph node, which makes it easy and fast to reason about its function. Unfortunately, the size of BDDs and hence the complexity involved with manipulating them is very sensitive to the order in which variables appear in the BDDs. This sensitivity to variable ordering can result in exponential space complexity of the BDD in the worst case. BDD packages that implement BDD building and manipulation algorithms use Dynamic Variable Ordering (DVO) algorithms to reduce the number of BDD nodes periodically. These algorithms tend to be expensive in both time and space complexity. Therefore BDD software packages rely on heuristics to compute a local minimum as opposed to a global minimum for reducing the number of BDD nodes, since computing a global minimum is prohibitively expensive.

In such an approach a set of nodes for which BDDs are required to be built, called "sink" nodes, are identified. Examples of sink nodes are outputs in an equivalence checking or false-paths analysis setting, or targets in a property checking or model checking setting. Next, BDDs for these nodes are obtained by building BDDs in a topological manner, starting at the inputs, for intermediate nodes in the circuit graph representation until the BDDs for the sink nodes are built.

Typical techniques use either a depth-first or a breadth-first approach to build BDDs topologically for sink nodes starting at the inputs. This process tends to suffer from an exponential space and hence time complexity in the worst case often times precluding BDDs for the sink nodes from being built at all. One reason for this blow-up is the (large) size of the intermediate BDDs required to be built in order to obtain the BDDs for the sink nodes. This results in a prohibitively large number of "alive" BDD nodes. A BDD is said to be alive if it is still needed to build BDDs for its fanout nodes. Thus, there is a need in the art for a technique of building BDDs that manages available resources efficiently by attempting to minimize the number of live BDDs and thereby reducing overall memory consumption.

SUMMARY OF THE INVENTION

An improved method, system and computer-readable medium for constructing binary decision diagrams for a netlist graph is disclosed. The method comprises traversing a netlist graph in a depth-first manner. At least one binary decision diagram is built for one input of a node of the netlist graph using a binary decision diagram for the other input of that node as a don't-care condition.

The above, as well as additional purposes, features, and advantages of the present invention will become apparent in the following detailed written description

BRIEF DESCRIPTION OF THE DRAWINGS

This invention is described in a preferred embodiment in the following description with reference to the drawings, in which like numbers represent the same or similar elements, as follows.

DETAILED DESCRIPTION OF A PREFERRED EMBODIMENT

The present invention provides an improved method, system, and computer readable medium for building binary decision diagrams (BDDs). As described below, the method of the invention minimizes the size of BDDs by heuristically factoring in available (already constructed) BDDs as don't-cares early enough to allow a more efficient building of BDDs for nodes in a circuit graph representation. The present invention manages available resources more efficiently by reducing the number of live BDDs. This reduces overall memory consumption and enables significant performance improvements over methods available in the prior art. The present invention reduces the problems of exponential complexity and associated resource consumption by managing available resources more efficiently than conventional techniques.

The present invention takes advantage of BDDs (of nodes) that have already been constructed and applies them smartly, and early on, as don't-cares when constructing BDDs for other nodes. The BDDs used as don't-cares are chosen so that they would have been used to constrain (AND) the BDDs for the node in order to obtain the BDD for the fan-out of this node. For example, given a 2-input AND gate and the BDD for one leg of the AND gate (i.e. the BDD for this leg of the AND gate has already been built) we may use this BDD as a don't-care when building the BDD for the other leg of the AND gate and then continue on to build the AND gate.

Note that by ANDing the BDDs for the two legs of the AND gate, the present invention is constraining the respective BDDs at the two legs with each other. The present invention takes advantage of this eventual constraining early on to simplify building the BDD for the other leg. Additionally, since the present invention utilizes the available BDD as a don't-care, it is used intelligently with resource bounds so as not to increase the size of the intermediate BDDs for the fan-in of the other leg of the AND gate. This method is very powerful, allowing BDDs to be built rather easily for nodes which otherwise would have otherwise exploded.

Figure 1:
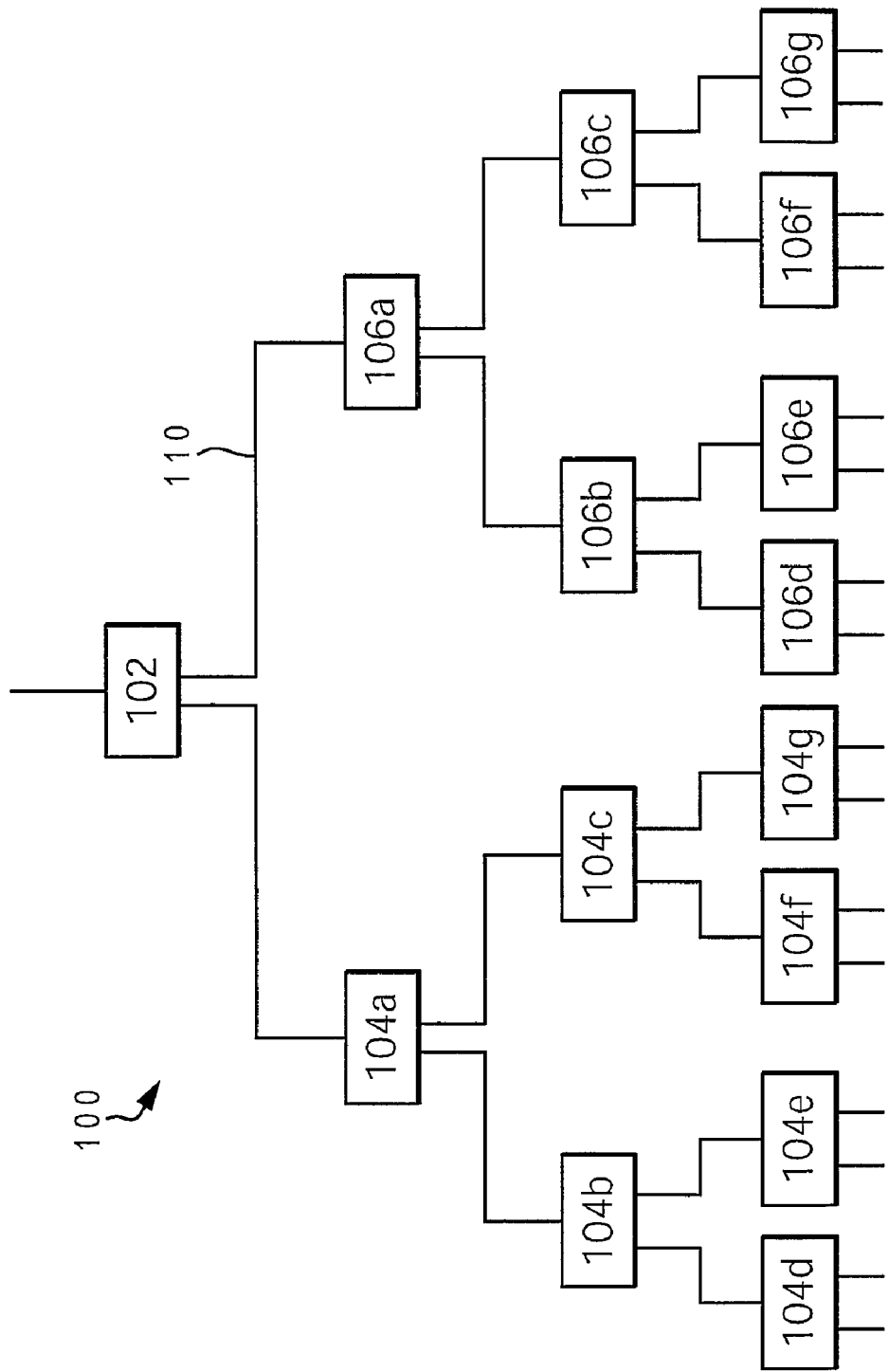
FIG. 1 is a block diagram of a netlist graph used to compactly represent a problem derived from circuit structures in computer-aided design of digital circuits.

With reference now to the figures, and in particular FIG. 1, netlist graph 100 is depicted in accordance with a preferred embodiment of the present invention. Netlist graph 100 contains a directed graph with vertices (nodes 102-106) representing gates, and edges 110 representing interconnections between those gates. Gates have associated functions, such as constants, primary inputs, combinational logic such as AND gates, and sequential elements (hereafter referred to as registers). Registers have two associated components: their next-state functions, and their initial-value functions; both can be represented as gates in netlist graph 100. Certain gates in the netlist may be labeled as "primary outputs", "targets", "constraints", etc; the semantics of these types are not critical to the present invention. In a preferred embodiment, the only combinational gate type in netlist graph 100 is a 2-input AND gate; inversions are represented implicitly as edge attributes.

A set of nodes for which BDDs need to be built, called "sinks", are identified. Sink node 102 of FIG. 1 is an example. The BDD for sink node 102 is built using a depth-first-search (DFS) schedule that builds BDDs for each sink node successively. For sink node 102, the technique traverses the circuit graph in a DFS manner and builds BDDs for nodes in a bottom-up fashion starting at inputs 104-106. For example, to build the BDD for node 102 the technique checks to see if node 104a has a BDD built. If it does, then it checks to see if node 106a has a BDD built. But if node 104a does not have a BDD built, then the technique checks to see if node 104b has a BDD built before it checks node 106a. Similarly, to build the BDD for node 104a the technique checks to see if node 104b has a BDD built. If it does, then it checks to see if node 104c has a BDD built. But if node 104b does not have a BDD built, then the technique checks to see if node 104d has a BDD built before it checks node 104c. The technique traverses the circuit graph in this "depth first" manner until it finds a node with a BDD built. Then BDDs are built from the bottom up. Once the BDDs for all the fan-outs of a node have been built, the BDD for that node can be freed or de-referenced. Note that it is important to free BDDs that are no longer needed to keep the number of BDD nodes in the BDD package to a minimum such that expensive BDD operations such as DVO are not impacted by the presence of spurious nodes.

Figure 2:
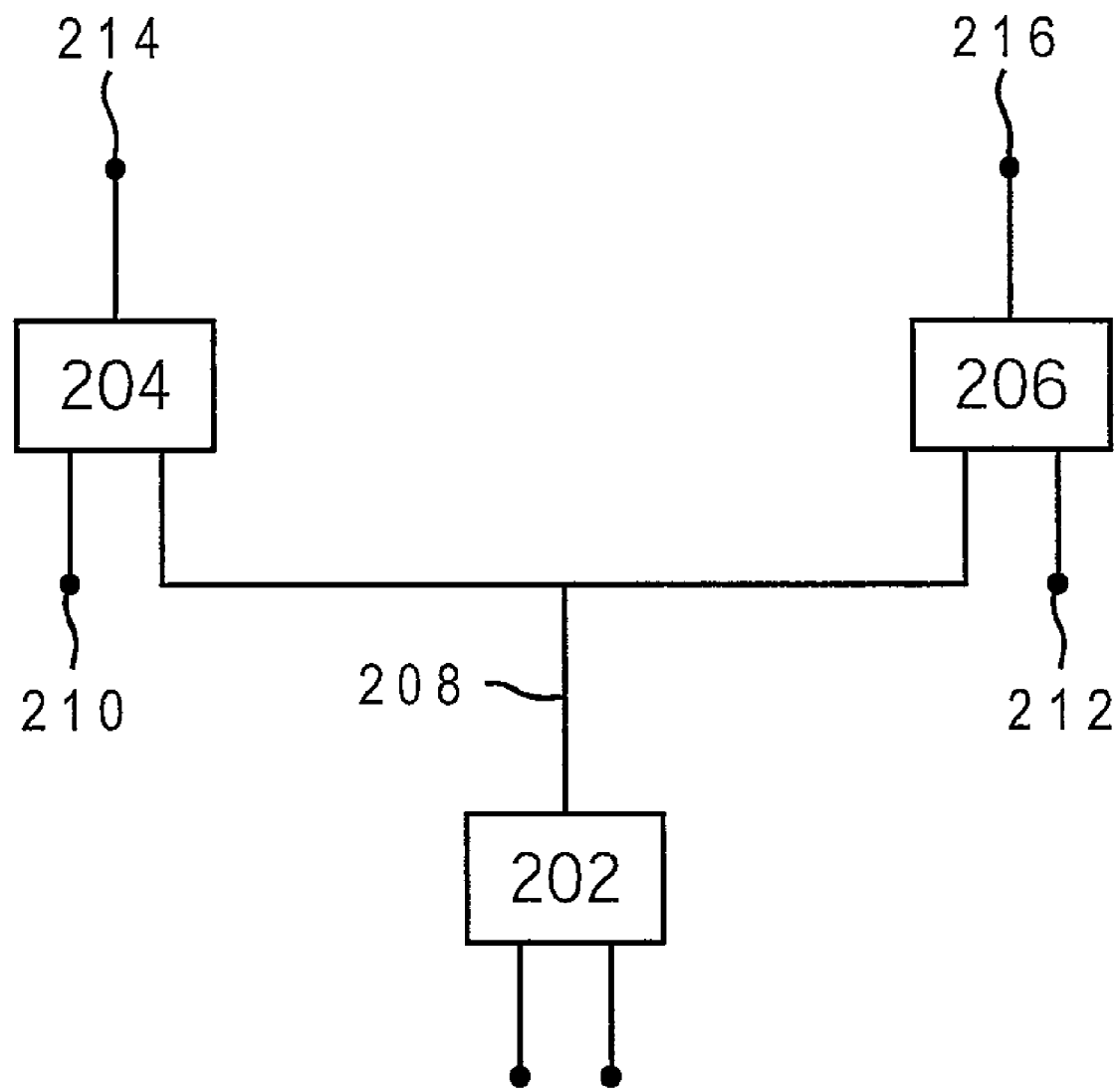
FIG. 2 is a block diagram of three nodes in a netlist graph, where the output of one node is an input to two other nodes.

Referring now to FIG. 2, assume that a BDD has already been built for input 210 of node 204. In order to build the BDD for output 214 of node 204, the BDD for input 208 needs to be built. Then input 208 and input 210 need to be ANDed together. Since the BDD for input 210 has already been built, it can be passed as a don't-care BDD along the other leg of node 204 (i.e. input 208). Similarly, the BDD for input 212 can be passed down input 208 when building the BDD for output 216 of node 206. Note that the don't-care BDDs passed down along input 208 are different in the two cases because the don't-caring condition is different. Hence, a side-effect or implication of this approach is that the BDD of a multi fan-out node (like node 202) that was don't-cared along one fan-in path will need to be rebuilt (again possibly using don't-caring) along a different fan-in path. It may be noted that this don't-caring scheme is applied recursively in a bottom-up fashion during the netlist BDD building. Hence, when building the BDD for input 208, the BDD for input 210 is used for don't-caring.

It may be the case that the function at input 208 results in its BDD exploding, even though the BDD for output 214 is a small BDD mainly due to the constraints that the BDD for input 210 impose on the function at output 214. The present invention takes advantage of this constraining early on so that we are able to complete building the BDD for input 208, hence the BDD for output 214, which otherwise may not have been feasible. Next the recursion goes down the two legs of node 202, each of which utilizes the BDD for input 210 as a don't-care. Additionally when one of the fan-ins of node 202 has its BDD built, it is ANDed with the current don't-care BDD, i.e. BDD for input 210 here, and this new BDD is passed down the other leg for don't-caring.

Figure 3:
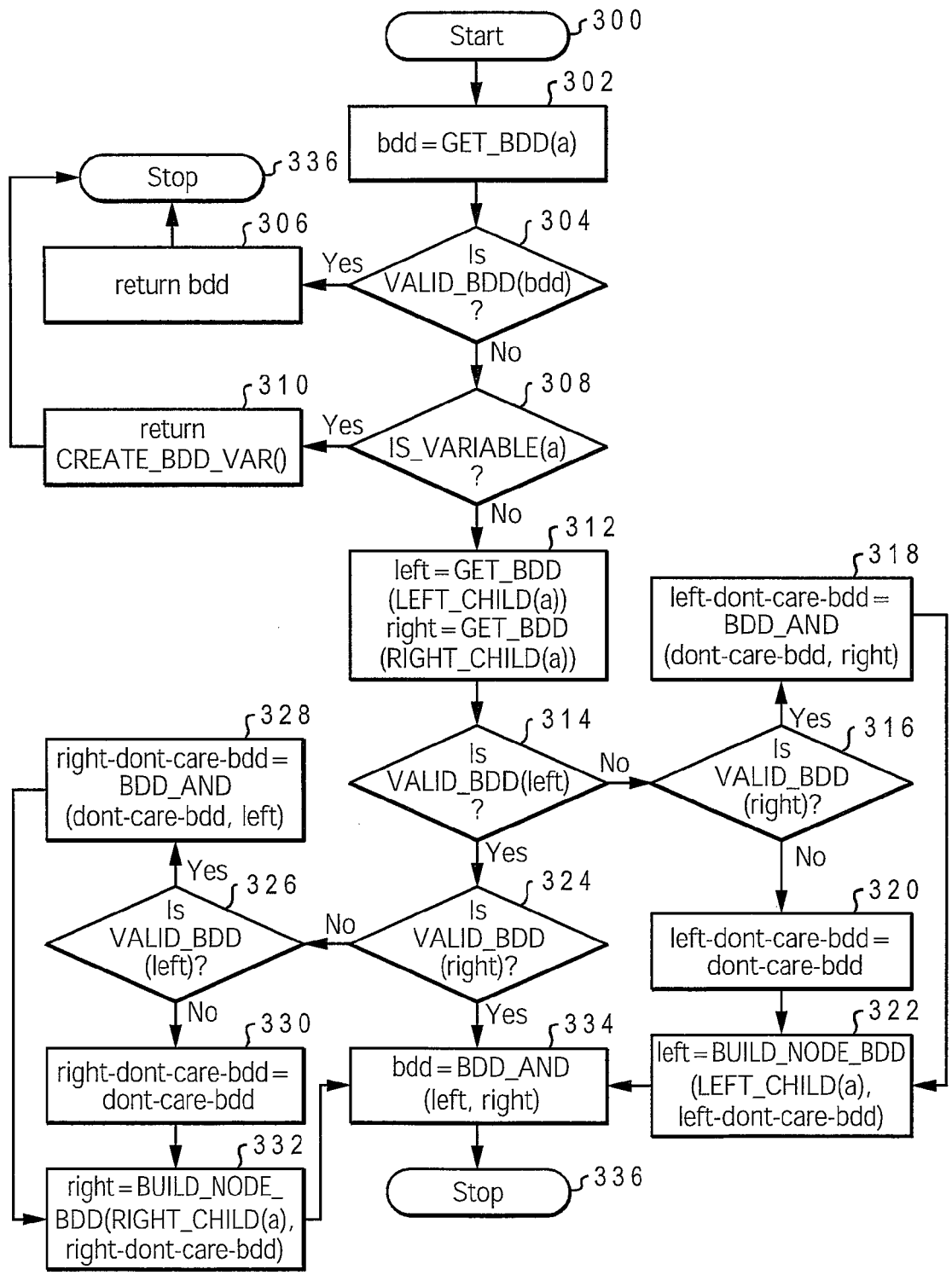
FIG. 3 is a flow diagram of a process for building binary decision diagrams optimally for nodes in a netlist graph using don't-caring, in accordance with the preferred embodiment of the present invention.

Referring now to FIG. 3, one or more embodiments of the present invention can be discussed as an algorithm, which can be represented as follows:

```
BDD BUILD_NODE_BDD(NODE a, BDD dont-care-bdd) {
    BDD bdd = GET_BDD(a);
    if(VALID_BDD(bdd)) return bdd;
    if(IS_VARIABLE(a)) return CREATE_BDD_VAR( );
    BDD left = GET_BDD(LEFT_CHILD(a));
    BDD right = GET_BDD(RIGHT_CHILD(a));
    if(NOT VALID_BDD(left) {
        if(VALID_BDD(right)) left-dont-care-bdd =
        BDD_AND(dont-care-bdd, right);
        else left-dont-care-bdd = dont-care-bdd;
        left = BUILD_NODE_BDD(LEFT_CHILD(a), left-dont-care-bdd);
    }
    if(NOT VALID_BDD(right) {
        if(VALID_BDD(left)) right-dont-care-bdd =
        BDD_AND(dont-care-bdd, left);
        else right-dont-care-bdd = dont-care-bdd;
        right = BUILD_NODE_BDD(RIGHT_CHILD(a),
        right-dont-care-bdd);
    }
    bdd = BDD_AND(left, right);
    return bdd;
}
```

The algorithm illustrated above is one alternative embodiment of the process described below and with respect to FIG. 3. Referring now to FIG. 3, the process starts at step 300 and proceeds to step 302. At step 302, the process gets the BDD for node (a). The process then moves to step 304, where the BDD obtained in step 302 is checked to see if it's a valid BDD. If so the process moves to step 306, where the BDD is returned and the process moves to step 336 and stops. If the BDD obtained in step 302 is not a valid BDD then the process moves to step 308.

In step 312, the left leg (child) and right leg (child) of node (a) are assigned as "left" and "right" respectively. In step 314, left is checked to see if it is a valid BDD. If it is not, then the process moves to step 316, where it checks to see if "right" is a valid BDD. If "right" is a valid BDD, the process moves to step 318, where "left-dont-care-bdd" is created by ANDing "right" and "dont-care-bdd". If "right" is not a valid BDD, then the process moves to step 320, where "left-dont-care-bdd" is set equal to "dont-care-bdd". The process then proceeds to step 322, where the BDD for "left" is built using the left child for node (a) and "left-dont-care-bdd". The process then moves to step 334, where the final "bdd" in constructed by ANDing "left" and "right", and ends at step 336.

Returning to step 314, if "left" is a valid BDD then the process moves to step 324, where "right" is checked to see if it is a valid BDD. If "right" is a valid BDD then the process moves to step 334, where the final "bdd" in constructed by ANDing "left" and "right", and ends at step 336. If "right" is not a valid BDD then the process moves to step 328, where "right-dont-care-bdd" is created by ANDing "dont-care-bdd" and "left". The process then moves to step 332, where the BDD for "right" is built using the right child for node (a) and "right-dont-care-bdd". The process then moves to step 334, where the final "bdd" in constructed by ANDing "left" and "right", and ends at step 336.

This method enables the construction of BDDs which otherwise would explode, thus causing verification to complete on examples where it otherwise would not. In accordance with one or more embodiments of the present invention, this method may be applied during the entire process of BDD construction. In accordance with one or more alternative embodiments, this method may be selectively invoked in a resource constrained manner. In such an embodiment, the BDD at a node is don't-cared if and only if it exceeds a certain predefined size to achieve a fine balance between the time and memory required to complete BDD building for the sink nodes.

Figure 4:
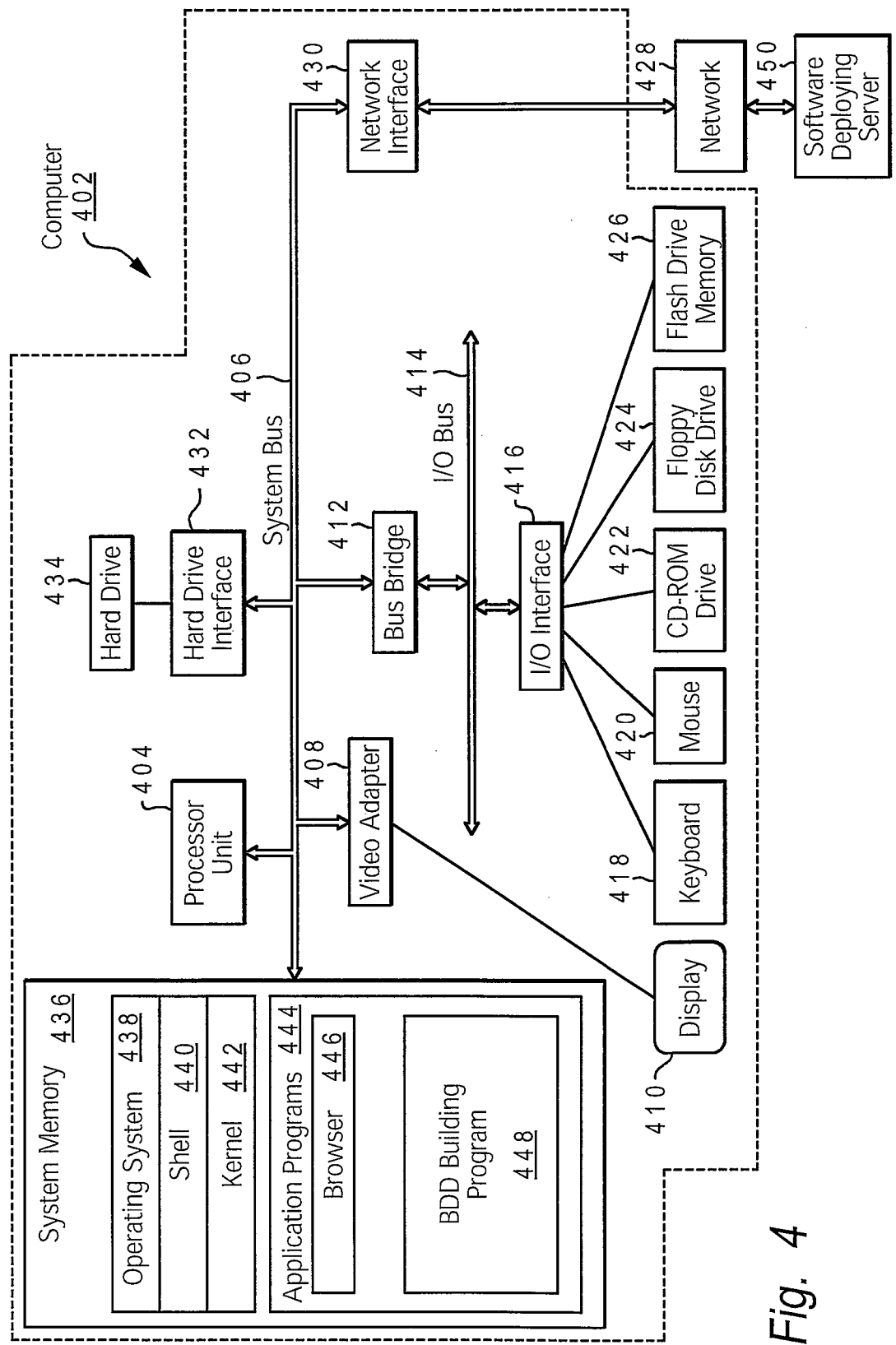
FIG. 4 is a block diagram of a general-purpose data processing system with which the present invention of a method, system and computer-readable medium for building binary decision diagrams optimally for nodes in a netlist graph using don't-caring may be performed.

With reference now to FIG. 4, there is depicted a block diagram of a computer 402, which can be utilized to respectively perform and control the method and circuitry described above. Note also that some or all of the exemplary architecture shown for computer 402 may be utilized by software deploying server 450 shown in FIG. 4.

Computer 402 includes a processor unit 404 that is coupled to a system bus 406. A video adapter 408, which drives/supports a display 410, is also coupled to system bus 406. System bus 406 is coupled via a bus bridge 412 to an Input/Output (I/O) bus 414. An I/O interface 416 is coupled to I/O bus 414. I/O interface 416 affords communication with various I/O devices, including a keyboard 418, a mouse 420, a Compact Disk—Read Only Memory (CD-ROM) drive 422, a floppy disk drive 424, and a flash drive memory 426. The format of the ports connected to I/O interface 416 may be any known to those skilled in the art of computer architecture, including but not limited to Universal Serial Bus (USB) ports.

Computer 402 is able to communicate with a software deploying server 450 via a network 428 using a network interface 430, which is coupled to system bus 406. Network 428 may be an external network such as the Internet, or an internal network such as an Ethernet or a Virtual Private Network (VPN). Note the software deploying server 450 may utilize a same or substantially similar architecture as computer 402.

A hard drive interface 432 is also coupled to system bus 406. Hard drive interface 432 interfaces with a hard drive 434. In a preferred embodiment, hard drive 434 populates a system memory 436, which is also coupled to system bus 406. System memory is defined as a lowest level of volatile memory in contact center computer 402. This volatile memory includes additional higher levels of volatile memory (not shown), including, but not limited to, cache memory, registers and buffers. Data that populates system memory 436 includes computer 402's operating system (OS) 438 and application programs 444.

OS 438 includes a shell 440, for providing transparent user access to resources such as application programs 444. Generally, shell 440 is a program that provides an interpreter and an interface between the user and the operating system. More specifically, shell 440 executes commands that are entered into a command line user interface or from a file. Thus, shell 440 (as it is called in UNIX®), also called a command processor in Windows®, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 442) for processing. Note that while shell 440 is a text-based, line-oriented user interface, the present invention will equally well support other user interface modes, such as graphical, voice, gestural, etc.

As depicted, OS 438 also includes kernel 442, which includes lower levels of functionality for OS 438, including providing essential services required by other parts of OS 438 and application programs 444, including memory management, process and task management, disk management, and mouse and keyboard management.

Application programs 444 include a browser 446. Browser 446 includes program modules and instructions enabling a World Wide Web (WWW) client (i.e., computer 402) to send and receive network messages to the Internet using HyperText Transfer Protocol (HTTP) messaging, thus enabling communication with software deploying server 450.

Application programs 444 in computer 402's system memory (as well as software deploying server 450's system memory) also include a BDD Building Program 448. BDD Building Program 448 includes code for implementing the process described in FIG. 3. In one embodiment, computer 402 is able to download BDD Building Program 448 from software deploying server 450.

The hardware elements depicted in contact center computer 402 are not intended to be exhaustive, but rather are representative to highlight essential components required by the present invention. For instance, contact center computer 402 may include alternate memory storage devices such as magnetic cassettes, Digital Versatile Disks (DVDs), Bernoulli cartridges, and the like. These and other variations are intended to be within the spirit and scope of the present invention.

Note further that, in a preferred embodiment of the present invention, software deploying server 450 performs all of the functions associated with the present invention (including execution of BDD Building Program 548), thus freeing contact center computer 402 from having to use its own internal computing resources to execute BDD Building Program 548.

Thus, it should be understood that at least some aspects of the present invention may alternatively be implemented in a program product. Programs defining functions of the present invention can be delivered to a data storage system or a computer system via a variety of signal-bearing media, which include, without limitation, non-writable storage media (e.g., CD-ROM), writable storage media (e.g., a floppy diskette, hard disk drive, read/write CD ROM, optical media), and communication media, such as computer and telephone networks including Ethernet. It should be understood, therefore in such signal-bearing media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

While the present invention has been particularly shown and described with reference to a preferred embodiment, it will be understood by those skilled in the art that various changes in form and detail may be made therein without departing from the spirit and scope of the invention.

What is claimed is:

1. A computer-implemented method for building binary decision diagrams comprising:

traversing a gate-level netlist graph including a plurality of nodes in a depth-first manner using a computer;

while traversing the netlist graph, building, using a computer, a binary decision diagram representation of the netlist graph, wherein building the binary decision diagram representation includes building at least one first binary decision diagram for a first input of a node among the plurality of nodes in said netlist graph using one or more second binary decision diagrams for a second input of said node as a don't-care condition;

wherein the step of building at least one first binary decision diagram for the first input of the node of said netlist graph using one or more second binary decision diagrams for the second input of said node as a don't-care condition is applied selectively when said at least one first binary decision diagram reaches a predetermined size.

2. The method according to claim 1, wherein the only combinational gate type of said netlist graph is a two-input AND gate, and wherein the node is a two-input AND gate.

3. The method according to claim 1, wherein said node comprises a sink node.

4. A computer-implemented method for building binary decision diagrams comprising:

traversing a gate-level netlist graph including a plurality of nodes in a depth-first manner using a computer;

while traversing the netlist graph, building, using a computer, a binary decision diagram representation of the netlist graph, wherein building the binary decision diagram representation includes building at least one first binary decision diagram for a first input of a first node among the plurality of nodes in said netlist graph using one or more second binary decision diagrams for a second input of said first node as a don't-care condition;

wherein the step of traversing the netlist graph in a depth-first manner further comprises:

determining whether a binary decision diagram has been constructed for the first input of the first node; and in response to determining that a binary decision diagram has been constructed for said first input of the first node, determining whether a binary decision diagram has been constructed for the second input of said first node.

5. The method according to claim 4, wherein the step of traversing a netlist graph in a depth-first manner further comprises:

in response to determining that a binary decision diagram has not been constructed for said first input of the first node, determining whether a binary decision diagram has been constructed for a second node among the plurality of nodes in the netlist graph; and wherein said first input of said first node comprises an output of said second node.

6. A data processing system for building binary decision diagrams, the data processing system comprising:

a processor unit;

data storage communicatively coupled to the processor unit, the data storage including program code that, when executed by the processor unit, causes the data processing system to perform:

traversing a gate-level netlist graph including a plurality of nodes in a depth-first manner; and building a binary decision diagram representation of the netlist graph during traversal, wherein the building includes building at least one first binary decision diagram for a first input of a node among the plurality of nodes in said netlist graph using one or more second binary decision diagrams for a second input of said node as a don't-care condition;

wherein the building at least one first binary decision diagram for the first input of the node of said netlist graph using one or more binary decision diagrams for the second input of that node as a don't-care condition is applied selectively when said at least one first binary decision diagram reaches a predetermined size.

7. The data processing system according to claim 6, wherein the only combinational gate type of said netlist graph is a two-input AND gate, and wherein the node is a two-input AND gate.

8. The data processing system according to claim 6, wherein said node comprises a sink node.

9. A data processing system for building binary decision diagrams, the data processing system comprising:

a processor unit;

data storage communicatively coupled to the processor unit, the data storage including program code that, when executed by the processor unit, causes the data processing system to perform:

traversing a gate-level netlist graph including a plurality of nodes in a depth-first manner; and building a binary decision diagram representation of the netlist graph during traversal, wherein the building includes building at least one first binary decision diagram for a first input of a first node among the plurality of nodes in said netlist graph using one or more second binary decision diagrams for a second input of said first node as a don't-care condition, wherein traversing a netlist graph in a depth-first manner further comprises:

determining whether a binary decision diagram has been constructed for the first input of the first node; and in response to determining that a binary decision diagram has been constructed for said first input of the first node, determining whether a binary decision diagram has been constructed for the second input of said first node.

10. The data processing system according to claim 9, wherein traversing a netlist graph in a depth-first manner further comprises:

in response to determining that a binary decision diagram has not been constructed for said first input of the first node, determining whether a binary decision diagram has been constructed for a second node among the plurality of nodes in the netlist graph; and wherein said first input of said first node comprises an output of said second node.

11. A program product, comprising:

a non-transitory computer-readable storage medium;

a computer program stored within the non-transitory computer-readable storage medium, that when executed, causes a computer to perform:

traversing a gate-level netlist graph including a plurality of nodes in a depth-first manner; and while traversing the netlist graph, building a binary decision diagram representation of the netlist graph, wherein building the binary decision diagram representation includes building at least one first binary decision diagram for a first input of a node among the plurality of nodes in said netlist graph using one or more second binary decision diagrams for a second input of said as a don't-care condition;

wherein building at least one first binary decision diagram for the first input of the node of said netlist graph using one or more binary decision diagrams for the second input of that node as a don't-care condition is applied selectively when said at least one first binary decision diagram reaches a predetermined size.

12. The program product according to claim 11, wherein the only combinational gate type of said netlist graph is a two-input AND gate, and wherein the node is a two-input AND gate.

13. A program product, comprising:
- a non-transitory computer-readable storage medium;
- a computer program stored within the non-transitory computer-readable storage medium, that when executed, causes a computer to perform:
  - traversing a gate-level netlist graph including a plurality of nodes in a depth-first manner; and
  - while traversing the netlist graph, building a binary decision diagram representation of the netlist graph, wherein building the binary decision diagram representation includes building at least one first binary decision diagram for a first input of a first node among the plurality of nodes in said netlist graph using one or more second binary decision diagrams for a second input of said first node as a don't-care condition;
  - wherein traversing a netlist graph in a depth-first manner further comprises:
    - determining whether a binary decision diagram has been constructed for the first input of the first node; and
    - in response to determining that a binary decision diagram has been constructed for said first input of the first node, determining whether a binary decision diagram has been constructed for the second input of said first node.

14. The program product according to claim 13, wherein the step of traversing a netlist graph in a depth-first manner further comprises:
- in response to determining that a binary decision diagram has not been constructed for said first input of the first node, determining whether a binary decision diagram has been constructed for a second node among the plurality of nodes in the netlist graph; and
- wherein said first input of said first node comprises an output of said second node.

* * * * *